United States Patent [19]
Takahashi et al.

[11] Patent Number: 5,552,707
[45] Date of Patent: Sep. 3, 1996

[54] RF PROBE WHICH CAN VARY DISTANCE BETWEEN RECEIVING COILS WHICH FACE EACH OTHER

[75] Inventors: Tetsuhiko Takahashi, Soka; Hiroyuki Takeuchi; Yoshikuni Matsunaga, both of Kashiwa, all of Japan

[73] Assignee: Hitachi Medical Corporation, Tokyo, Japan

[21] Appl. No.: 297,060

[22] Filed: Aug. 29, 1994

[30] Foreign Application Priority Data

Aug. 30, 1993 [JP] Japan .................................. 5-214151

[51] Int. Cl.⁶ .................................................. G01R 33/28
[52] U.S. Cl. .............................................. 324/318; 324/322
[58] Field of Search ........................... 324/318, 322, 324/300, 314; 128/653.5

[56] References Cited

U.S. PATENT DOCUMENTS

| | | | |
|---|---|---|---|
| 4,587,493 | 5/1986 | Sepponen | 324/318 |
| 4,752,738 | 6/1988 | Patrick et al. | 324/318 |
| 4,825,164 | 4/1989 | Requardt | 324/318 |
| 4,891,596 | 1/1990 | Mitomi | 324/318 |
| 5,196,796 | 3/1993 | Misic et al. | 324/322 |
| 5,270,656 | 12/1993 | Roberts et al. | 324/322 |
| 5,280,248 | 1/1994 | Zou | 324/318 |
| 5,307,806 | 5/1994 | Jones | 324/318 |
| 5,321,360 | 6/1994 | Mansfield | 324/322 |
| 5,382,903 | 1/1995 | Young | 324/318 |
| 5,389,880 | 2/1995 | Mori | 324/318 |

FOREIGN PATENT DOCUMENTS

| | | | |
|---|---|---|---|
| 0338624A1 | 10/1989 | European Pat. Off. | 324/322 |
| 0412824A2 | 2/1991 | European Pat. Off. | 324/322 |
| 3323657A1 | 1/1984 | Germany | 324/322 |
| 3628035 | 2/1988 | Germany . | |
| 3905564A1 | 9/1990 | Germany | 324/322 |
| 4325206 | 2/1994 | Germany . | |
| 2500175 | 12/1988 | Japan . | |
| 0213432 | 4/1989 | Japan . | |
| 4114633 | 5/1992 | Japan . | |
| 5154126 | 6/1993 | Japan . | |

OTHER PUBLICATIONS

Hayes et al, "vol. Imaging with MR Phased Arrays", Mag. Res. in Med. vol. 18, pp. 309–319 (1991).
Roemer et al, "The NMR Phased Array", Mag. Res. in Med. vol. 16 pp. 192–225 (1990).

*Primary Examiner*—Sandra L. O'Shea
*Assistant Examiner*—Raymond Y. Mah
*Attorney, Agent, or Firm*—Antonelli, Terry, Stout & Kraus

[57] ABSTRACT

An RF probe including: two coils for detecting MR signals which are arranged at positions which face each other at a predetermined distance; an apparatus for changing a distance between those coils; and an apparatus for reducing a high frequency coupling between the two coils which is caused due to a change in distance between the coils, in accordance with the distance between the coils.

11 Claims, 9 Drawing Sheets

RF PROBE WHICH CAN VARY DISTANCE BETWEEN RECEIVING COILS WHICH FACE EACH OTHER

BACKGROUND OF THE INVENTION

The present invention relates to a radio frequency (RF) probe for a nuclear magnetic resonance apparatus for detecting nuclear magnetic resonance (hereinafter, referred to as an NMR) signals from hydrogen, phosphorus, and the like in a subject and for visualizing a density distribution of a nucleus, a relaxation time distribution, or the like.

A nuclear magnetic resonance imaging (MRI) apparatus is an apparatus such that a high frequency magnetic field is applied to a subject put in a magnetostatic field, NMR signals as a kind of high frequency magnetic field which are consequently generated from the subject are detected by RF probes, and the detection signals are subjected to processes such as Fourier transformation, image reconstruction, and the like, thereby obtaining a visual image. As such RF probes, various kinds of coils for a head region, coils for an abdominal region, local surface coils, or the like which surround a region of interest of the subject (for example, human being) are used.

Among those RF probes, although a sensitivity of the surface coil is higher than that of the coil for the head region or the coil for the abdominal region, a field of view is limited. Therefore, a method whereby a plurality of surface coils are properly slightly overlapped and arranged so that each surface coil doesn't magnetically mutually couple with the adjacent surface coil and NMR signals received by the surface coils are synthesized, thereby substantially widening the field of view, namely, a multiple coil (also called a phased array coil) has been proposed. A principle of the above method has been disclosed in, for example, JP-A-2-500175, JP-A-2-13432, or Magnetic Resonance in Medicine, Vol. 16, pages 192 to 225, (1990). An example in which the phased array coils are applied for an abdominal region has been disclosed in Magnetic Resonance in Medicine Vol. 18, pages 309 to 319, (1991).

FIG. 1 shows a schematic diagram of a conventional multiple coil for an abdominal region. The multiple coil comprises four unit coils 10a to 10d. Namely, the multiple coil is constructed by the upper coils 10a and 10b as a twin coil and the lower coils 10c and 10d as a twin coil. A human body is arranged between the upper coils and the lower coils, while setting the direction of vertebra into a z direction. Each coil is designed so as to resonate at a frequency of a magnetic resonance signal to be detected. The signals from the unit coils are amplified by amplifiers 20 and signal processed, respectively. After that, they are synthesized, thereby forming one image signal. Since the signal from each coil has a high signal-to-noise (S/N) ratio, the image formed by synthesizing also has a high picture quality. However, a distance between the upper coils and the lower coils is fixed, if it is changed, the S/N ratio will remarkably deteriorate.

That is, in the conventional multiple coil, characteristics have been optimized for only an arrangement of the fixed specific coils.

On the other hand, in case of the probes for an abdominal region or the like, in order to allow the probes to be always closely adhered to the shape of the abdominal region in an optimum state, RF probes which can vary the interval between the upper and lower coils so that they can cope with various shapes of human bodies are strongly demanded.

For example, in case of constructing such that the multiple coil of FIG. 1 can be vertically moved as it is, when the coil interval is large, the high frequency electromagnetic coupling between the coils which face each other is relatively weak. However, when the coil interval is small, the high frequency electromagnetic coupling between the coils is strong. Therefore, when the probe is made vertically movable while keeping such a shape, so long as the distance between the coils which face each other is small, a resonance frequency is largely deviated due to an increase in high frequency coupling between the coils. Even if the resonance frequency is adjusted, the S/N ratio remarkably deteriorates. Now, the high frequency coupling mainly comprises the magnetic coupling.

In the conventional multiple coil as mentioned above, when the interval between the coils is made variable, there is a problem such that the magnetic coupling between the coils changes due to a change in interval and the picture quality is deteriorated.

SUMMARY OF THE INVENTION

It is an object of the invention to solve the above problems and to provide an RF probe which can vary an interval between coils and which also has a high sensitivity.

According to the present invention, the above object is accomplished by an RF probe for detecting a magnetic resonance signal of a subject put in a magnetostatic field space, comprising: an apparatus which includes at least a first coil arranged in the magnetostatic field space and a second coil arranged at a position which faces the first coil at a predetermined interval and which changes a relative distance between the first and second coils; and an apparatus in which a current whose level is almost equal to and whose direction is opposite to the level and direction of a current that is induced from the first coil to the second coil for the high frequency coupling between both coils which fluctuates in association with a change in relative distance between both coils is supplied to the second coil in accordance with a distance between both coils, thereby reducing or eliminating a high frequency coupling between the first and second coils.

According to one specific construction of an apparatus for reducing the high frequency coupling, it comprises two auxiliary coils which are serially connected to the first and second coils, respectively, wherein a degree of the magnetic coupling of the two auxiliary coils changes in accordance with the distance between the first and second coils.

According to another specific construction, it comprises a single auxiliary coil which is magnetically coupled to both of the first and second coils, wherein a degree of the magnetic coupling between the first and second coils and the auxiliary coil is changed in accordance with the distance between the first and second coils.

As still another specific construction, it comprises a capacitive element circuit connected in parallel between cables connected to the first and second coils, respectively, wherein a value of the capacitive element is changed in accordance with the distance between the first and second coils. With such a construction, a current to cancel an induced current flows into the second coil through the capacitive element.

The relative distance between the first and second coils is selected continuously or step by step. In case of selecting the relative distance between the coils step by step, an adjustment point of the apparatus for reducing the high frequency coupling changes step by step in correspondence to the relative distance which was selected step by step.

The first and second coils may be circular or rectangular coils or a multiple coil. Outputs of the first and second coils are simultaneously detected.

According to the invention, in an RF probe of an MRI apparatus which is constructed by a plurality of coils, an apparatus for changing a geometrical relative distance between the first and second coils is provided and an apparatus for reducing the high frequency coupling between the coils in association with a change in relative distance are provided. Therefore, the distance between the coils can be changed so as to be fitted to the subject and the high frequency coupling which occurs at this time can be reduced by the reducing apparatus accompanied with the main coil, so that the deterioration of the S/N ratio of the coils can be effectively suppressed and a good image can be provided.

DESCRIPTION OF THE PREFERRED EMBODIMENTS

An embodiment of the present invention will now be described in detail hereinbelow with reference to the drawings.

Figure 2:
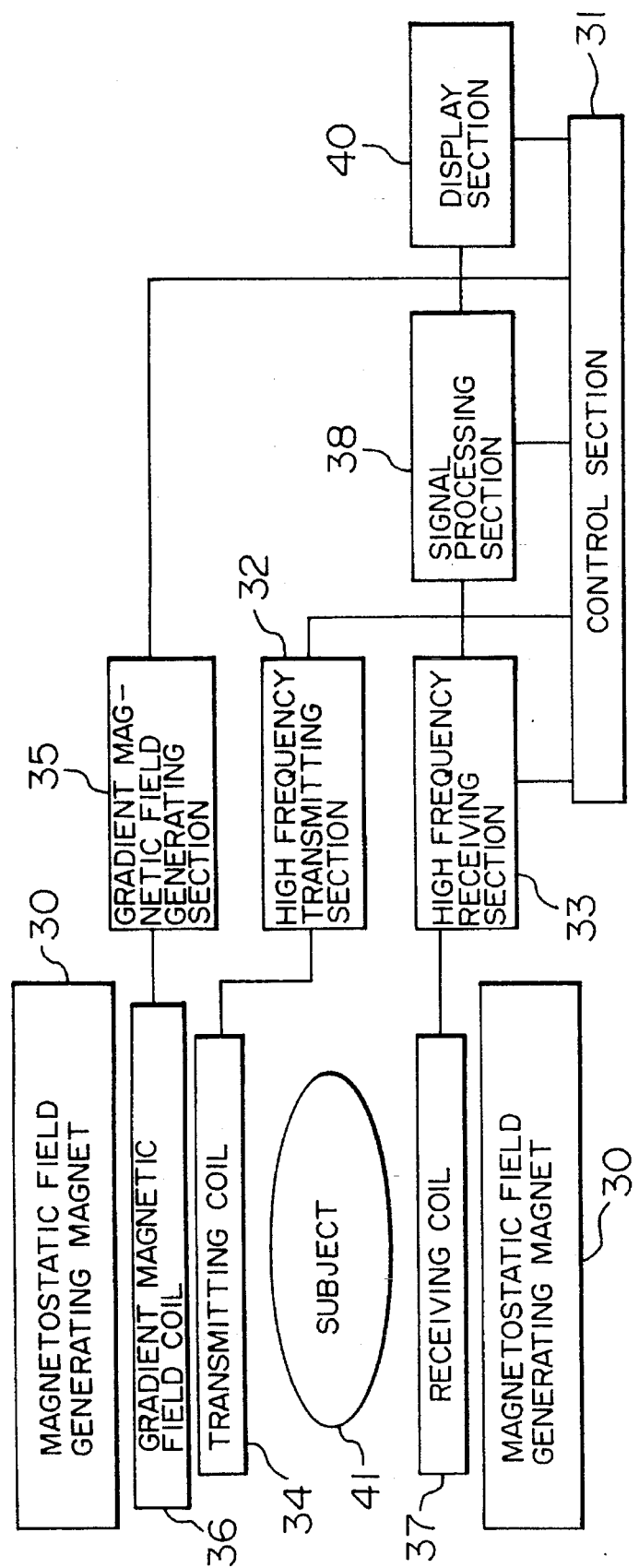
FIG. 2 is a block diagram of an MRI apparatus using an RF probe according to the invention.

FIG. 2 is a diagram showing a whole construction of an example of a nuclear magnetic resonance imaging (MRI) apparatus to which the invention is applied. The MRI apparatus obtains a tomogram image of a subject 41 by using an NMR phenomenon and comprises: a magnetostatic field generating magnet 30 to generate a magnetostatic field into a space in which the subject 41 is to be placed; a gradient magnetic field generating section 35 and a gradient magnetic field coil 36 to generate a gradient magnetic field into the space; a high frequency transmitting section 32 and a transmitting coil 34 for generating a high frequency magnetic field into the space; a receiving coil 37 serving as an RF probe and a high frequency receiving section 33 for detecting MR signals which are generated from the subject 41; a signal processing section 38 for processing the signal received by the high frequency receiving section 33 and for obtaining an image; a display section 40 to display the image; and a control section 31 to control the above component elements.

The magnetostatic field generating magnet 30 generates a strong and uniform magnetostatic field in the horizontal or vertical direction around the subject 41. Typically, a magnetic field of a magnetic field intensity within a range from 0.1 T to 4.7 T is generated. A superconduction magnet or a permanent magnet is used as a magnet. The transmitting coil 34 generates a high frequency magnetic field of frequencies in a range from 4 MHz to 200 MHz by an output of the high frequency transmitting section 32. The gradient magnetic field coil 36 generates gradient magnetic fields Gx, Gy, and Gz in three directions of X, Y, and Z by an output of the gradient magnetic field generating section 35. A tomogram surface for the subject 41 can be set in accordance with a method of applying the gradient magnetic fields. The high frequency receiving section 33 receives a signal of the receiving coil 37. An output of the high frequency receiving section 33 is subjected to processes such as Fourier transformation, image reconstruction, and the like. After that, the resultant signal is displayed as an image by the display section 40.

The invention is applied to such an RF probe, namely, receiving coil 37 of the MRI apparatus. In FIG. 2, although the receiving coil 37 is arranged in the space around the subject 41, the receiving coil 37 is not limited to a whole body probe but may be also a local coil such as surface coil, array coil, or the like.

Figure 1:
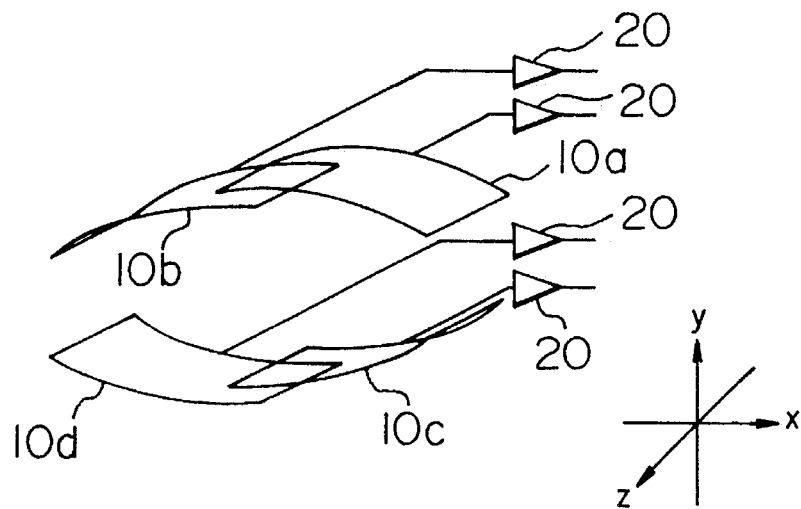
FIG. 1 is a diagram showing a conventional multiple coil.
Figure 3:
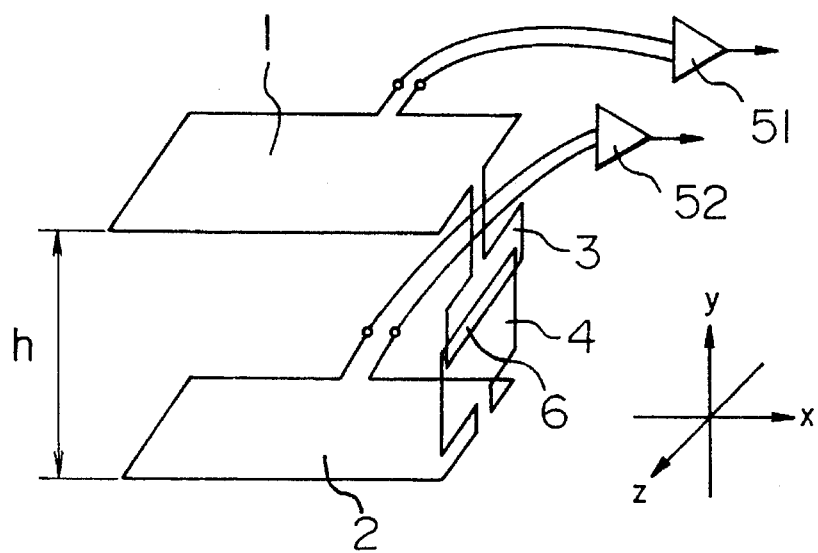
FIG. 3 shows an embodiment of the RF probe of the invention.

FIG. 3 shows an embodiment of the receiving coil 37 according to the invention. In the embodiment, the receiving coil 37 comprises: two upper and lower main coils 1 and 2; and auxiliary coils 3 and 4 which are serially connected to those main coils 1 and 2.

Although the main coils 1 and 2 are used to receive the MR signals, the auxiliary coils 3 and 4 don't intend to receive the MR signals.

Although a plurality of capacitors for resonance are generally connected to the main coils 1 and 2, the capacitors are omitted in the diagram and the coils are shown as rectangular coils of one turn for simplicity. Outputs of the coils 1 and 2 are amplified by amplifiers 51 and 52, respectively.

Now, assuming that the direction of vertebra of a human body is set to the z direction, the main coils 1 and 2 are arranged in parallel in an x-z plane at a distance h, thereby forming an upper coil and a lower coil. The human body is arranged between the coils 1 and 2. Each coil is designed so as to resonate at a frequency of a magnetic resonance signal to be detected. Such a frequency lies within a range from about 8 MHz to 100 MHz in a clinical apparatus for practical use. The main coils 1 and 2 have means for changing the relative distance h and will be explained hereinlater.

Now, assuming that the surfaces on which the main coils 1 and 2 are formed are set to the (x-z) plane, the auxiliary coils 3 and 4 are formed in the direction that is almost perpendicular to the (x-z) plane. The auxiliary coils 3 and 4 function as an apparatus for reducing the high frequency coupling between both coils which fluctuates in association with a change in relative distance h between the coils 1 and 2. According to the above apparatus, a current whose level is almost equal to and whose direction is opposite to the level and direction of a current that is induced from the coil 1 to the coil 2 is supplied to the coil 2 in accordance with the distance between both coils, thereby cancelling the high frequency coupling between both coil. Due to this, in the coil outputs which are input to input terminals of the amplifiers 51 and 52, a state in which there is no substantial magnetic coupling between the upper coil 1 and the lower coil 2 is obtained. A coupling intensity between the auxiliary coils is almost proportional to an area "S" of an overlap section 6 of the auxiliary coils 3 and 4. From the diagram, assuming that the distance between the main coils 1 and 2 is set to h, the coil area "S" increases with a decrease in h and the magnetic coupling of the auxiliary coils also increases. Therefore, the increase in coupling between the upper and lower main coils 1 and 2 when the value of h decreases can be cancelled by an increase in coupling between the auxiliary coils 3 and 4.

Desirable characteristics of the auxiliary coils which satisfy such conditions (conditions of the coils which overlap by an overlap area such as to erase the magnetic coupling for a change in distance h) will now be described.

First, when it is assumed that the main coils 1 and 2 overlap in the y direction and the coil area is constant, a coupling coefficient of the main coils 1 and 2 can be expressed by a function k(h) of the distance h between both coils. The coupling coefficient k(h) is a decreasing function of h and can be calculated with respect to a special coil shape by an actual measurement or by a computer simulation. A mutual inductance M between the coils is given by $$M^2 = k(h)^2 L_1 L_2$$

by using inductances $L_1$ and $L_2$ of the upper and lower main coils 1 and 2. To eliminate the magnetic coupling between the coils 1 and 2, a mutual inductance M' between the auxiliary coils 3 and 4 is adjusted so as to be equal to M (M'=M) and the coupling between the main coils 1 and 2 is cancelled by the coupling between the auxiliary coils 3 and 4.

The mutual inductance M' between the auxiliary coils 3 and 4 is given by $$M'^2 = k'^2 L_1' L_2'$$

by using inductances $L_1'$ and $L_2'$ of the upper and lower auxiliary coils 3 and 4 and a coupling coefficient k' of them. $L_1'$ and $L_2'$ are constant. The coupling coefficient k' depends on an overlap area "S" of the auxiliary coils 3 and 4. When the distance in the x direction between the auxiliary coils is constant, k' can be expressed by a function k'(s) of "S".

Therefore, to always eliminate the coupling for a different interval h between the main coils, it is sufficient to satisfy the following relation.

$$M = M' \qquad (1)$$

$$\therefore k(h)\sqrt{L_1 L_2} = k'(S)\sqrt{L_1' L_2'}$$

Now, considering a case where the coils 3 and 4 are closely adhered, k'(S) is approximated to $k_0'\cdot S$ by using a constant $k_0'$, so that $$S = \frac{k(h)}{k_0'} \frac{\sqrt{L_1 L_2}}{\sqrt{L_1' L_2'}} \qquad (2)$$

is obtained. S is a function of h and an example (actual measured values) thereof is shown by a solid line in FIG. 4.

Figure 5:
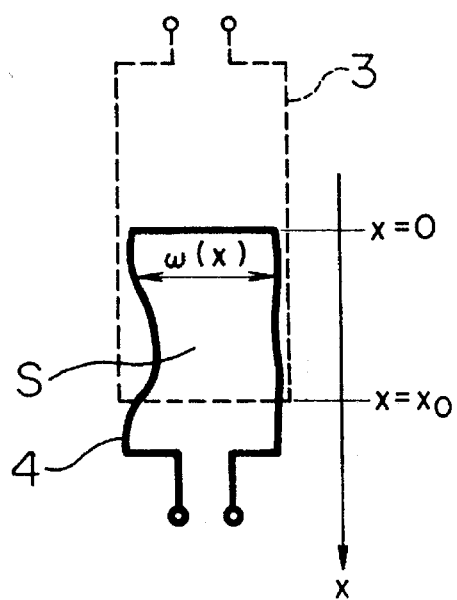
FIG. 5 is a diagram for deciding a shape of the auxiliary coil.

The optimum shape of the auxiliary coil will now be examined. First, it is considered that the shape of the auxiliary coil 3 has a rectangular shape and the auxiliary coil 4 has an arbitrary shape as shown in FIG. 5.

The coil 4 overlaps with the coil 3 in a range of $x=x_0$ from the position x=0. Assuming that a width of coil is set to w(x), the area "S" is $$S = \int_0^{x_0} w(x)dx \qquad (3)$$

w(x) in the case where the overlap length $x_0$ follows h will now be considered. It is assumed that the coils have a construction shown in FIG. 6A. From the equations (2) and (3), the relation between $x_0$ and h is obtained. That is, $$\int_0^{x_0} w(x)dx = \frac{k(h)}{k_0'} \frac{\sqrt{L_1 L_2}}{\sqrt{L_1' L_2'}} \qquad (4)$$

However, since there is the following relation $$x_0 = b_0 + (h_0 - h) \qquad (5)$$

we obtain $$\int_0^{b_0+(h_0-h)} w(x)dx = \frac{k(h)}{k_0'} \frac{\sqrt{L_1 L_2}}{\sqrt{L_1' L_2'}} \qquad (4')$$

By differentiating (4') in consideration of dx=dh, we obtain $$w(x) = -\frac{dk(h)}{dh} \frac{\sqrt{L_1 L_2}}{k_0'\sqrt{L_1' L_2'}} \qquad (6)$$

The initial condition of the coil shape is as follows by assuming that $h=h_0$ in (4')

$$\frac{k(h_0)}{k_0'} \frac{\sqrt{L_1 L_2}}{\sqrt{L_1' L_2'}} = \int_0^{b_0} w(x)dx \qquad (7)$$

The shape which satisfies the equations (6) and (7) is the optimum shape of the coil 4. It is sufficient that the coil has a rectangular shape which is slightly larger than the coil 4.

Figure 6A:
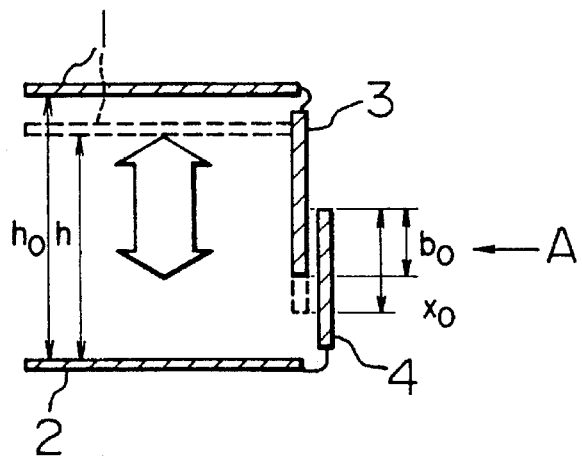
FIGS. 6A and 6B are diagrams showing an embodiment of the auxiliary coil.
Figure 6B:
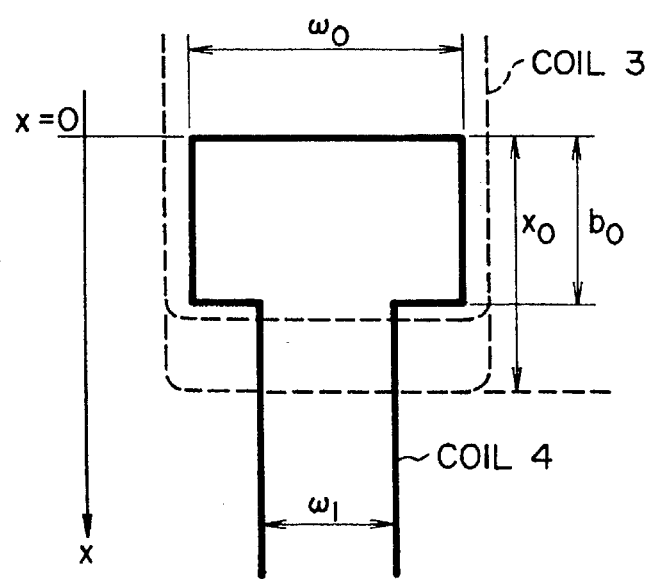

As a specific shape of the coil 4 shown in FIG. 6A, a shape in which two rectangles are combined as shown in FIG. 6B is now considered. FIG. 6B is a perspective view when it is seen from the direction of an arrow A in FIG. 6A. The following equation is obtained from variables shown in the diagram and the equation (7).

$$w_0 = \frac{k(h_0)}{k_0' b_0} \frac{\sqrt{L_1 L_2}}{\sqrt{L_1' L_2'}} \qquad (7')$$

According to the above shape, it is approximated by setting w(x) to a constant. That is, $$w(x) = \begin{cases} w_0 (0 \leq x \leq b_0) \\ w_1 (b_0 < x) \end{cases}$$

In this case, from the equations (3) and (5), $$\begin{aligned} S &= w_0 b_0 + w_1(h_0 - h) \qquad (8) \\ &= (w_0 b_0 + w_1 h_0) - w_1 h \end{aligned}$$

Figure 4:
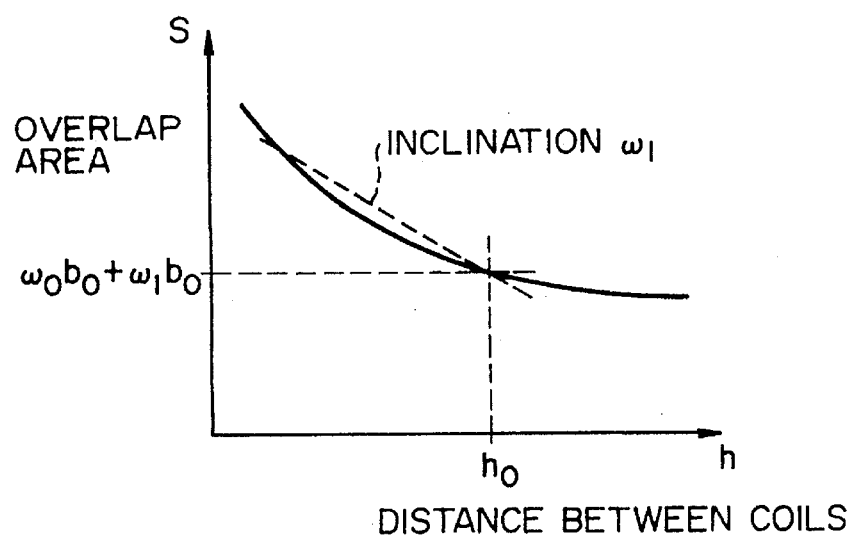
FIG. 4 is a diagram showing the relation between the overlap area of an auxiliary coil to reduce the magnetic coupling and the distance between coils.

This corresponds to that the curve of "S" in FIG. 4 is approximated by a straight line shown by a broken line. When the range of h is so narrow to be 20 cm to 30 cm, the coil shape can be simplified as mentioned above.

Figure 7:
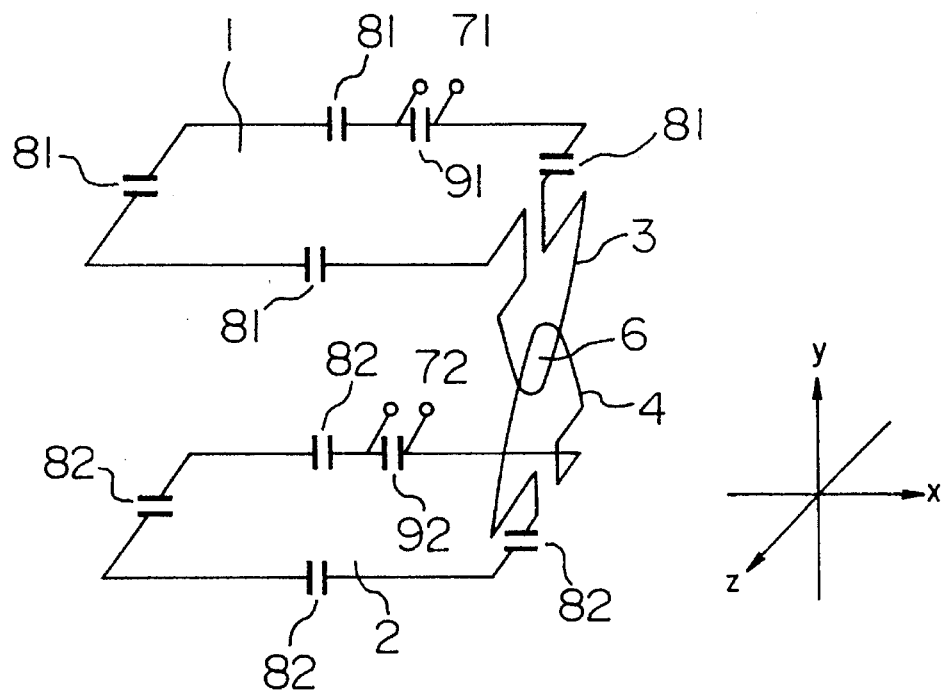
FIG. 7 is a diagram showing another embodiment of an auxiliary coil.

FIG. 7 shows an example of a specific RF probe of an MRI apparatus which is designed so as to detect a proton. In such a probe, a wire material of each of the coils 1 and 2 is made by a copper plate having, for example, a width of 10 mm and a thickness of 0.5 mm. A size of typical main coil is set to about 25 cm×15 cm. The distance h between the main coils 1 and 2 is set to about 15 cm to 25 cm. Four capacitors 81 for resonance are serially inserted to the coil 1. Four capacitors 82 for resonance are also serially inserted to the coil 2. Detecting ports 71 and 72 which are connected to input terminals of the amplifiers are connected to both ends of capacitors 91 and 92 for impedance matching, respectively. The probe is designed so as to detect a proton by a nuclear magnetic field resonance apparatus of a magnetic field intensity of, for example, 1.5 T. In this case, a resonance frequency of the probe is equal to 63.8 MHz and an impedance is equal to, for example, 50 $\Omega$. The shapes of the main coils 1 and 2 can be also set to circular or elliptical shapes as necessary.

The auxiliary coils 3 and 4 are serially connected to the main coils 1 and 2, respectively. Each of the auxiliary coils is formed by, for example, a copper wire having a width of 5 mm and a thickness of 2 mm. The shape is set to a rectangular shape in a range, for example, from 7 cm×7 cm to 15 cm×15 cm or can be also set to a circular shape, an elliptical shape, or the like. Or, further desirably, it can be also set to a shape which satisfies the conditions of the equations (6) and (7) mentioned above. When the distance between the coils 1 and 2 is narrowed, the overlap area "S" of the auxiliary coils 3 and 4 increases and an increase in magnetic coupling between the main coils is cancelled by the magnetic coupling between the auxiliary coils.

An apparatus for changing the distance between the main coils 1 and 2 will now be described.

Figure 8:
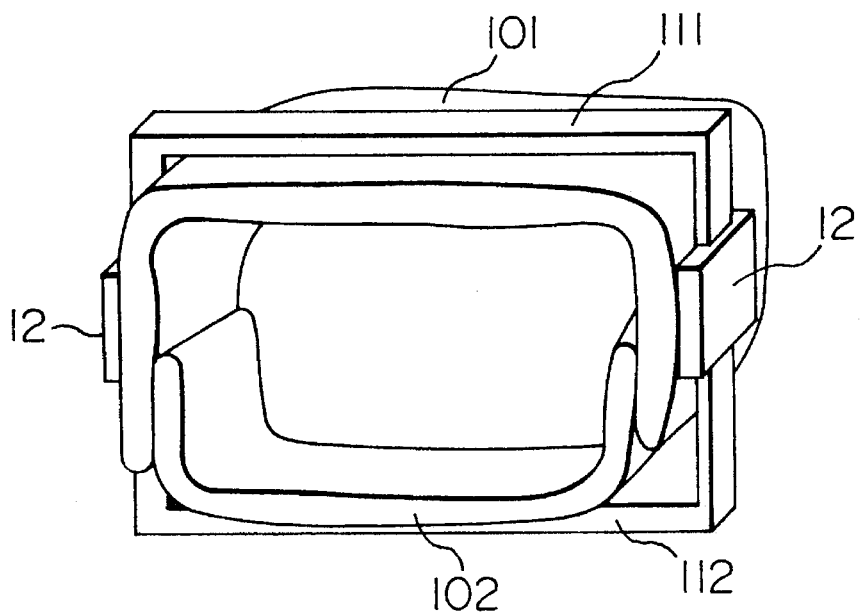
FIG. 8 is an external view of an apparatus for varying the distance between the main coils.

As shown in FIG. 8, (the main coil 1 and the auxiliary coil 3) and (the main coil 2 and the auxiliary coil 4) are respectively covered by waterproof flexible covers 101 and 102 made by synthetic fibers or the like and are certainly connected to supporting members 111 and 112. The supporting members 111 and 112 are connected by a connecting section 12. A whole portion of the connecting section 12 is covered by a hard cover 121 made by an acrylic material or the like as shown in FIG. 5.

Figure 9:
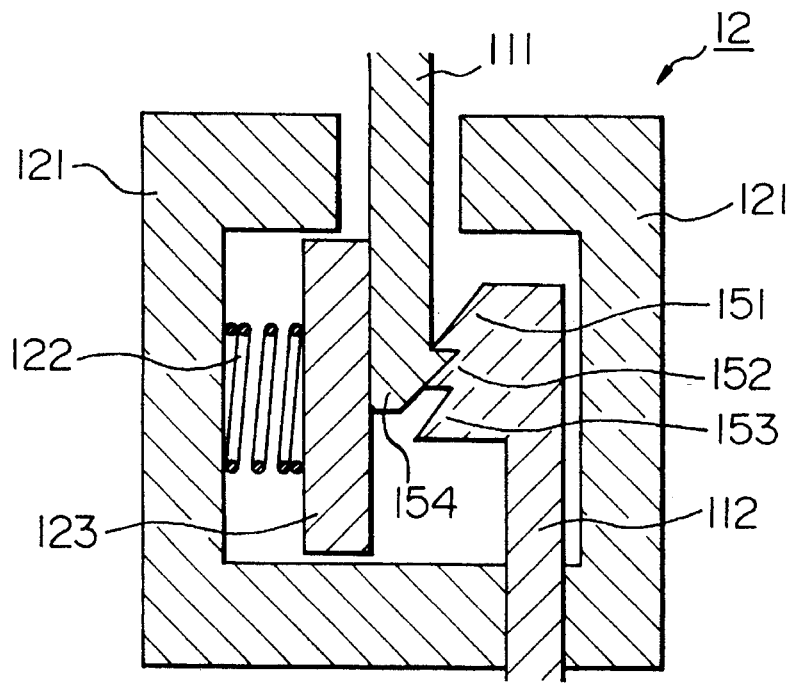
FIG. 9 is a diagram showing an embodiment of a connecting section of two upper and lower main coils.

In an embodiment shown in FIG. 9, the connecting section 12 is constructed so as to change the connecting state of the supporting members 111 and 112 step by step. That is, three wedges 151, 152, and 153 are formed at the edge of the supporting member 112 and a wedge 154 is formed at the edge of the other supporting member 111. The supporting members 111 and 112 are connected by coupling the wedges of both supporting members. Although the diagram shows the case where the wedge 154 is coupled with the wedge 151, the wedge 154 can be coupled to the wedge 152 or 153 by increasing a force to depress the supporting member 111. The supporting member 111 is strongly pressed and fixed by a pressing plate 123 which was strongly depressed by a spring 122. Even when the wedge 154 of the supporting member 111 is coupled with any one of the wedges 151 to 153, the coupling can be stably held. When the operator attached the probe to the subject, the supporting member 111 is manually depressed in consideration of the size of subject. By selecting the connecting state of the supporting members 111 and 112 in correspondence to the subject as mentioned above, the relative distance (h) between the main coils can be changed. Although the positions of the main coils are fundamentally decided by the supporting members 111 and 112, the coil peripheral portions are covered by the waterproof flexible covers 101 and 102 as shown in FIG. 3 and are flexibly adapted to the shape of subject. Therefore, the coils can be closely adhered to the subject without giving any pain to the subject.

It is an object of the coupling portion of the supporting members to hold the geometrical conditions of the coils step by step. No electrical coupling is performed. In association with the stepwise coupling of the main coils, the overlap of the auxiliary coils in FIG. 3 is also fixed step by step and the coupling between the main coils is also eliminated in any cases.

In the embodiment of FIG. 9, although the interval between the coils has been set step by step, the positions of the coils can be also continuously set. In this case, if the number of wedges 151 to 153 in FIG. 9 is increased from 3 to about 20 and the fixed interval is reduced, the position can be substantially continuously changed. In the case where the maximum variable width is equal to 20 cm, the discrete interval is equal to 20 cm/20=1 cm. When the number of wedges is further increased to, for example, 40, the discrete interval is equal to 0.5 cm and a degree of continuity can be raised. As a method of continuously changing the position, it is also possible to use another well-known method such as a method using a sliding mechanism and a pressing screw or the like.

Another embodiment of an apparatus for eliminating the magnetic coupling between the main coils according to the invention will be further described.

Figure 10A:
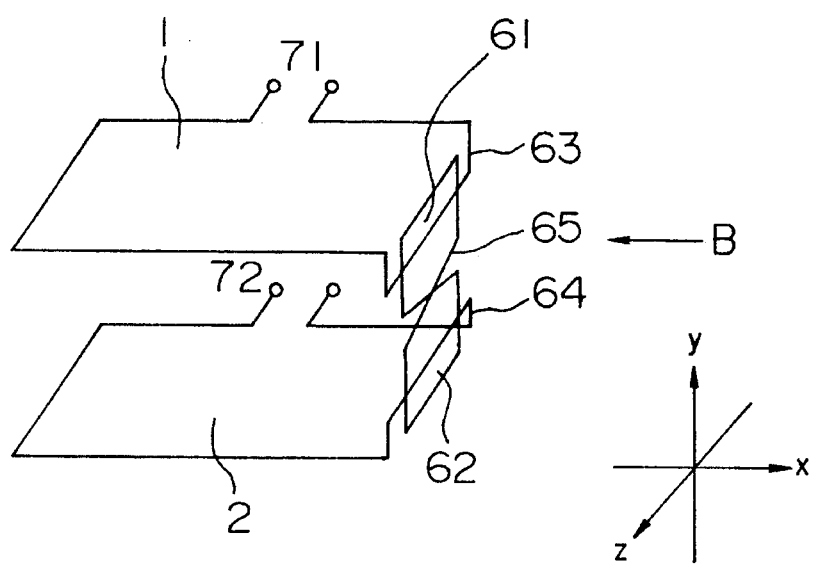
FIGS. 10A and 10B are diagrams showing another embodiment of an RF probe of the invention.
Figure 10B:
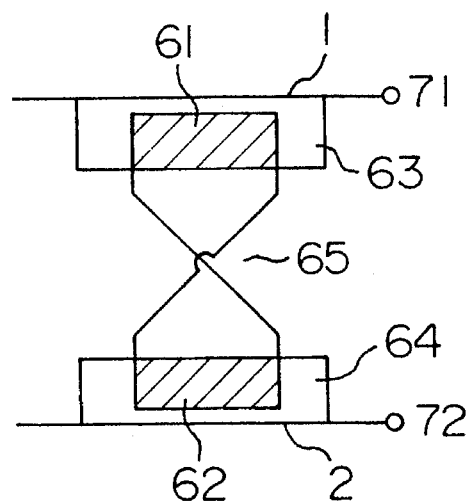

In an embodiment shown in FIG. 10A, the main coils 1 and 2 are formed in parallel on the x-z planes in a manner similar to the main coils in FIGS. 3 and 7 and parts of them are deformed so as to perpendicularly intersect with the x-z plane. FIG. 10B is a perspective view when it is seen from an arrow B in FIG. 10A. An auxiliary coil 65 as a mechanism to eliminate the magnetic coupling between the main coils has an 8-like shape. One of the 8-like shape (namely, an upper half portion) of the auxiliary coil 65 has a deformed portion 63 of the main coil 1 and a coupling area 61 and forms a magnetic coupling. The other portion (namely, a lower half portion) has a deformed portion 64 of the main coil 2 and a coupling area 62 and forms a magnetic coupling. An intensity of such a magnetic coupling changes in accordance with the value of the relative distance between the main coils. Since the auxiliary coil 65 has an 8-like shape, it has a function such that a current (not shown) induced from the coil 1 to the auxiliary coil 65 is given to the coil 2 as an induced current having the direction opposite to the direction of the current induced in the coil 2 by the coil 1 and the magnetic coupling between the main coils is cancelled. Since the intensity when the auxiliary coil 65 is coupled with the main coils 1 and 2 is determined by the coupling areas 61 and 62, the object of the invention is accomplished by changing those coupling areas in accordance with the distance between the main coils in a manner similar to the embodiment of FIG. 3.

Figure 11:
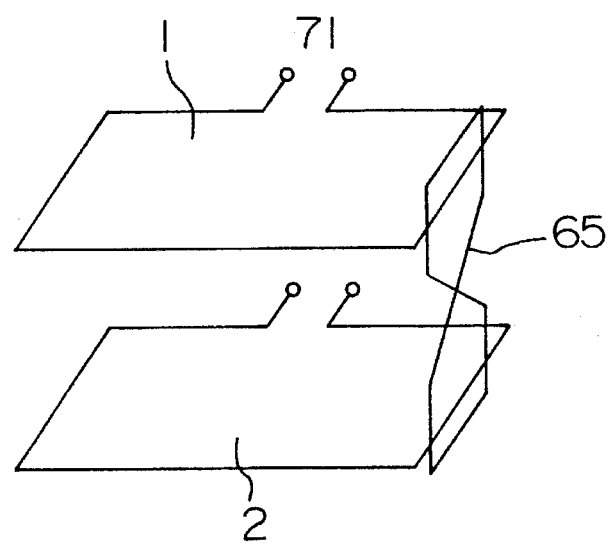
FIG. 11 is a diagram showing still another embodiment of an RF probe of the invention.

As shown in FIG. 11, it is also possible to eliminate the deformed portions 63 and 64 in the main coils 1 and 2. In this case, a size of magnetic coupling region between the main coils 1 and 2 and the auxiliary coil 65 changes in accordance with the distance between the coils 1 and 2 and the magnetic coupling between the coils 1 and 2 can be eliminated in a manner similar to the case of FIG. 10A.

Figure 12:
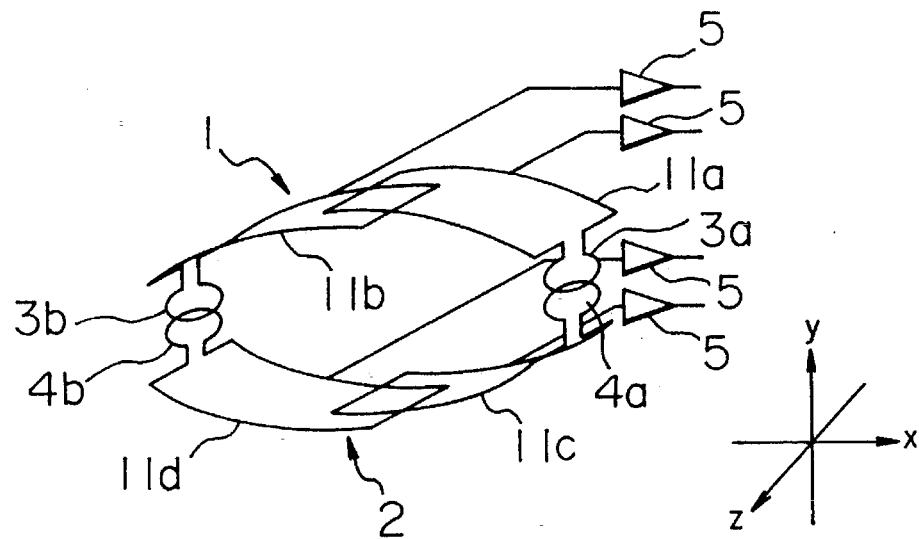
FIG. 12 is a diagram showing further another embodiment of an RF probe of the invention.

In an embodiment shown in FIG. 12, the main coil 1 comprises a pair of multiple coils 11a and 11b and the main coil 2 comprises a pair of multiple coils 11c and 11d. In this case, each pair of coils serving as an upper coil 1 or lower coil 2 are properly overlapped and arranged so as not to be mutually magnetically coupled. Outputs of the coils 11a to 11d are simultaneously detected through amplifiers 5 and are synthesized as an NMR signal.

Auxiliary coils 3a, 3b, 4a, and 4b are serially connected to coils 11a, 11b, 11c, and 11d so as to perpendicularly intersect with the planes (x-z planes) on which the coils are formed. The auxiliary coils 3a and 4a are overlapped and the auxiliary coils 3b and 4b are overlapped, thereby causing a magnetic coupling so as to set off the high frequency (magnetic) coupling which occurs due to a change in relative distance between the upper coil 1 and the lower coil 2.

In the above embodiment, since the magnetic coupling has been used as an apparatus for reducing the high frequency coupling, the current between the coils is effectively cancelled, there is no loss of signal due to the unnecessary high frequency current, and the S/N ratio of the signal is high. On the other hand, since no unnecessary current flows, there is an advantage such that the apparatus is also not influenced by the environment around the coils. In the above embodiment, since there is no need to detect the position and the cancelling operation can be automatically performed, an additional electronic circuit and control parts such as sensor, motor, and the like are unnecessary.

Figure 13:
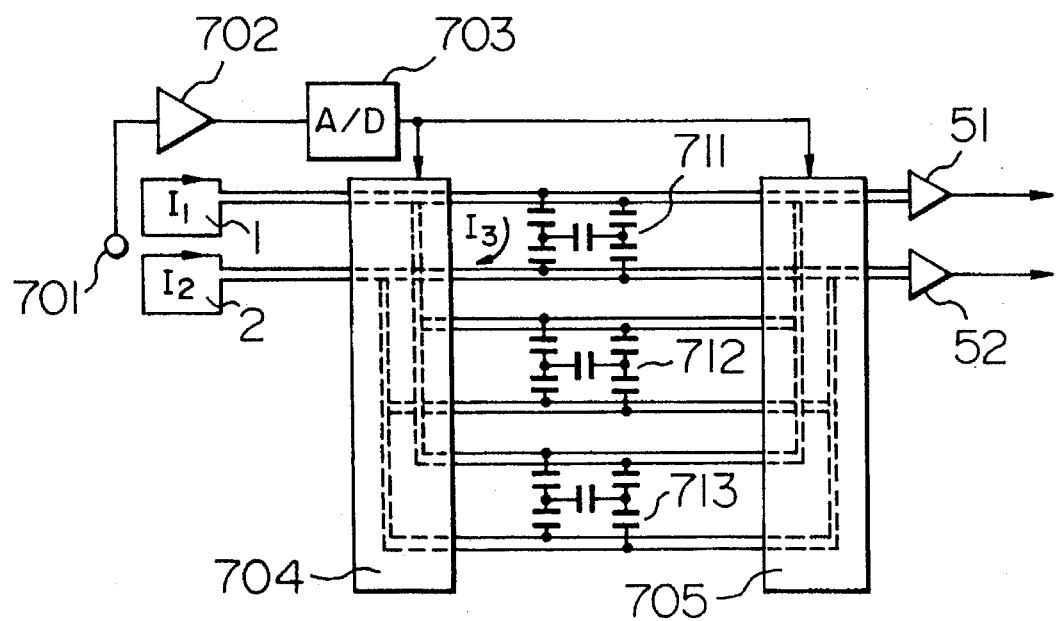
FIG. 13 is a diagram showing further another embodiment of an RF probe of the invention.

FIG. 13 shows a further different embodiment of a coupling eliminating apparatus of the invention. In the embodiment, the coupling eliminating apparatus comprises: a position sensor 701 to read an interval between the main coils 1 and 2; an A/D converter 703; three coupling eliminating circuits 711, 712, and 713 corresponding to a plurality of (three, here) relative positions of the main coils 1 and 2; and switches 704 and 705 to change over those coupling eliminating circuits. It is assumed that the interval (relative distance) h between the main coils 1 and 2 can be selected step by step by, for example, the apparatus as shown in FIGS. 8 and 9.

The position sensor 701 reads the interval between the main coils 1 and 2 and generates as an electric signal. An output of the position sensor 701 is amplified by an amplifier 702 and converted into a digital signal by the A/D converter 703. The digital signal is used to control the switches 704 and 705. The switch 704 connects the outputs of the coils 1 and 2 to an optimum one of the coupling eliminating circuits 711, 712, and 713 on the basis of the value of the digital signal. Those coupling eliminating circuits are typically well-known circuits each comprising five capacitors. Capacitances of the capacitors constructing each circuit are optimized for the first relative position of the main coils 1 and 2 in case of the circuit 711, are optimized for the second relative position of the main coils 1 and 2 in case of the circuit 712, and are optimized for the third relative position of the main coils 1 and 2 in case of the circuit 713. The switch 705 is interlocked with the switch 704 and connects the signals which passed through the optimum circuits to the amplifiers 51 and 52, respectively. The amplified signals are sent to the high frequency receiving section (33 in FIG. 2).

In the case where the circuit 711 was selected, when it is assumed that a current $I_2$ is induced to the coil by a current $I_1$ of the coil 1, a current $I_3$ to cancel the current $I_2$ flows through the capacitors of the circuit 711.

Figure 14:
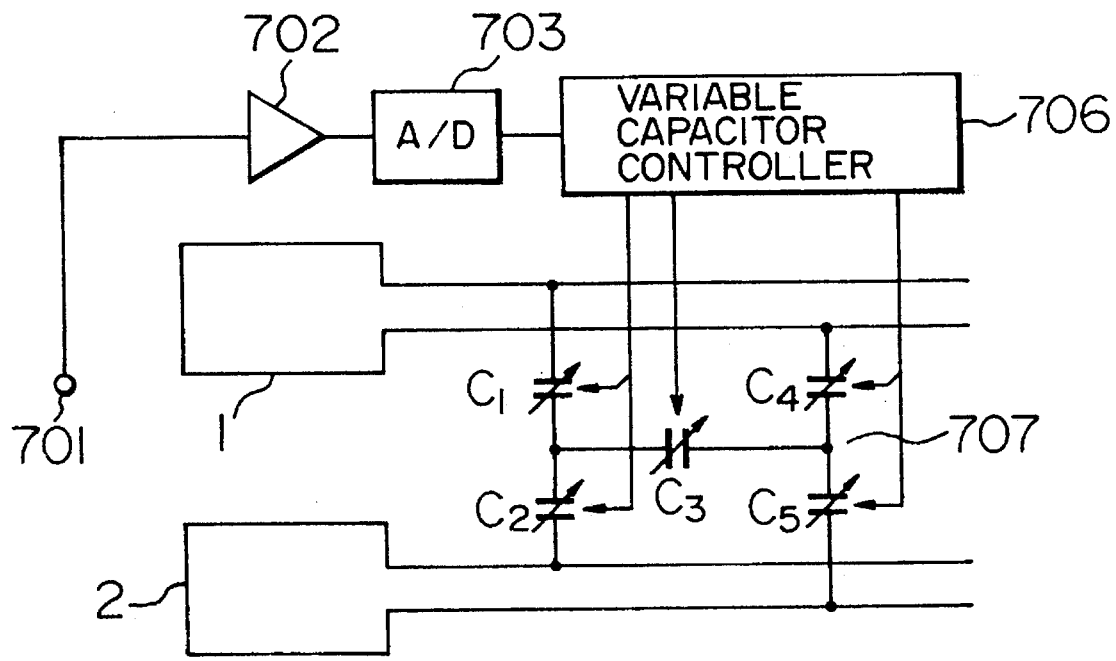
FIG. 14 is a diagram showing further another embodiment of an RF probe of the invention.

In the embodiment shown in FIG. 13, the construction such that the circuits 711 to 713 having different constants are prepared in parallel and are switched by the switches has been shown. However, as shown in FIG. 14, it is also possible to construct in a manner such that only one coupling eliminating circuit 707 is used as such coupling eliminating circuits and variable capacitors $C_1$ to $C_5$ are used as capacitors constructing the circuit 707 and capacitances of the variable capacitors are controlled by a variable capacitor controller 706 on the basis of an output of the A/D converter 703. In this case, there is a feature such that a continuous optimum circuit constant can be selected for a continuous position change of the main coil.

The present invention is not limited to the foregoing preferred embodiments but many variations and modifications are possible within the spirit of the invention.

What is claimed is:

1. An RF probe comprising:
   a first coil and a second coil which are arranged in a magnetostatic field space for independently detecting MR signals emitted from a subject, in which said first and second coils are arranged at positions which face each other at a predetermined distance, each of said first and second coils having an output port for transforming detected MR signals to amplifier means;
   means for changing the distance between said first and second coil means; and
   decoupling means for reducing a high frequency coupling between said first and second coils so that a magnitude of reduction of said high frequency coupling changes in accordance with the distance between said first and second coils.

2. An RF probe according to claim 1, wherein said decoupling means for reducing said high frequency coupling includes means for reducing said high frequency coupling by allowing a current to flow in said second coil, said current flowing in said second coil having a level substantially equal to a level of an induced current that is induced in said second coil by said first coil and having a flow direction opposite to a flow direction of said induced current.

3. An RF probe according to claim 2, wherein said decoupling means for reducing said high frequency coupling includes a third auxiliary coil which is serially connected to said first coil and a fourth auxiliary coil which is serially connected to said second coil and said third and fourth auxiliary coils are arranged at positions so as to be magnetically coupled in a manner such that a degree of said magnetic coupling changes in accordance with the distance between said first and second coils.

4. An RF probe according to claim 3, wherein said third and fourth auxiliary coils are provided so as to be perpendicular to said first and second coils, respectively.

5. An RF probe according to claim 4, wherein said third and fourth auxiliary coils have a mutually overlapped portion and an area of said overlapped portion changes in accordance with the distance between said first and second coils, so that the degree of said magnetic coupling changes.

6. An RF probe according to claim 5, wherein the area of said overlapped portion automatically changes when the distance between said first and second coils changes.

7. An RF probe according to claim 2, wherein said decoupling means for reducing said high frequency coupling includes an 8-like shaped single auxiliary coil which is electromagnetically coupled to said first and second coils and an intensity of the magnetic coupling between said first and second coils and said auxiliary coil changes in accordance with the distance between said first and second coils.

8. An RF probe according to claim 1, wherein said first and second coils include a circular or rectangular coil.

9. An RF probe according to claim 1, wherein said first and second coils include a multiple coil.

10. An RF probe according to claim 1, wherein said decoupling means for reducing said high frequency coupling includes:
   means for detecting the distance between said first and second coils;
   a plurality of capacitive element circuits which are provided so as to be connected in parallel between cables connected to said first and second coils, respectively; and switching means for selecting one of said capacitive element circuits on the basis of an output of said detecting means and for connecting the selected capacitive element circuit in parallel between said cables.

11. An RF probe according to claim 1, wherein said decoupling means for reducing said high frequency coupling includes:

means for detecting the distance between said first and second coils;

a capacitive element circuit connected in parallel between cables connected to said first and second coils, respectively; and control means for changing a value of a capacitor of said capacitive element circuit on the basis of an output of said detecting means.

* * * * *